April 22, 1969 C. E. GOLTSOS ET AL 3,440,407
TEMPERATURE CONTROLLED CIRCUIT BOARDS
Filed Dec. 29, 1966
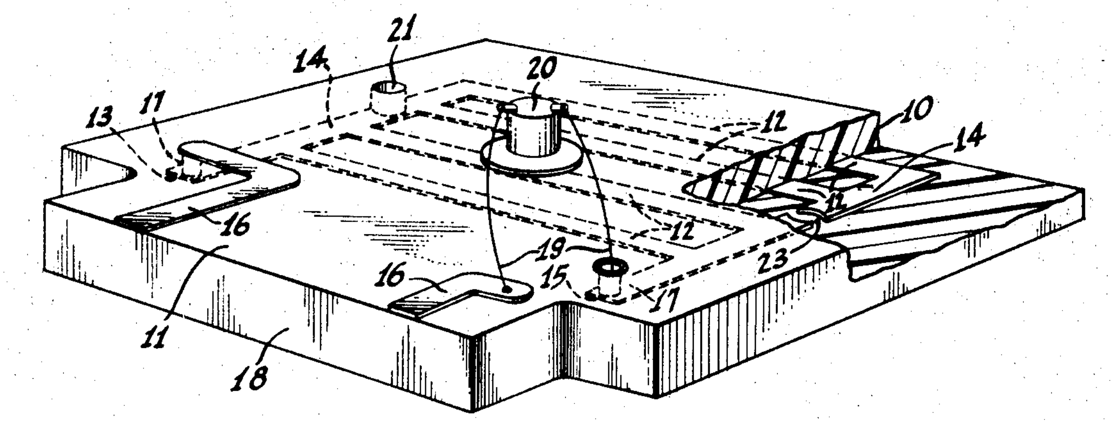
INVENTORS
COSTAS E. GOLTSOS &
ANTHONY AMATO
BY Edward J. Norton
ATTORNEY 3,440,407

TEMPERATURE CONTROLLED CIRCUIT BOARDS

Costas E. Goltsos, Newton, and Anthony Amato, Bedford, Mass., assignors to Radio Corporation of America, a corporation of Delaware Filed Dec. 29, 1966, Ser. No. 605,877
Int. Cl. H05b *1/02*
U.S. Cl. 219—494 1 Claim

ABSTRACT OF THE DISCLOSURE

A circuit board having a grid of resistance heating elements embedded in an insulating substrate. The heating of the board can be localized by severing the grid at strategic points. A thermostat is orientated to control the temperature at selected portions of the board.

This invention relates generally to circuit boards and, more particularly, to a temperature controlled circuit board assembly provided with the capability of maintaining predetermined temperature ranges.

In recent years, circuit boards, particularly circuit boards having circuitry imprinted thereupon, have gained widespread acceptance in the electronic industry. Given such a board imprinted with passive elements, it is possible to locate and mount active elements in any desired manner to provide electrical circuit configurations thereupon. Quite often, however, these active elements, or some of them, are of the type which are temperature sensitive and must be maintained within a narrow temperature range to insure proper operation. A crystal is a good example of such an element. Where ample space is available these components may be placed within oven containers, mounted with circuit boards, and operated as self-contained units. In light of recent trends toward miniaturization, however, space is always at a premium and the provisions required for such self-contained heating ovens become more and more difficult to provide.

Accordingly it is an object of the present invention to provide a circuit board assembly having self-contained heater elements and flexibility as to the size of the area thereupon to be temperature controlled.

A further object of the present invention is to provide a temperature controlled circuit board assembly which is compact in size, inexpensive to manufacture, and inexpensive to heat.

The above-mentioned objects as well as other features of the present invention will become more apparent by reference to the following description taken in conjunction with the accompanying drawing wherein the single figure is an isometric view, partly in section, of a circuit board embodying the concept of the present invention.

Referring now to the drawing there is shown a printed circuit board comprising an insulating substrate 10. The substrate 10 has embedded within it a grid of resistive heating elements 12 which, in this instance, are disposed in parallel relationship. The ends of each of these heating elements 12 are connected to respective ones of two bus bars 14 which are located at the edges of the substrate 10, perpendicular to the heating elements 12. The bus bars 14 are similarly embedded within the substrate 10. The bus bars are arranged with two input terminals 13 and 15. Upon the application of a source of input current to these input terminals 13 and 15, a circuit path is completed via the bus bars 14 and the grid system 12. The current flowing through the resistive grid 12 results in the radiation of energy in the form of heat through the substrate 10 causing the temperature of the circuit board to rise; the amount of temperature rise being proportional to the current flow.

The embedded input terminals 13 and 15 of the bus bars 14 are projected through the substrate 10 to the top surface 11 thereof via appropriate means, i.e., plated holes 17. Conductive tabs 16 are extended from these surface projections to the terminal edge 18 of the circuit board. A source of input current (not shown) may be connected to these terminal tabs 16 in any one of a number of ways, the most common being through the use of a conventional edge connector.

In the drawing a thermostat 20 is shown mounted on the surface of the circuit board. The thermostate 20 is electrically connected in series, via leads 19, between the source of input current and terminal 15 of the bus bar 14. The thermoelectrical characteristics of the thermostat 20 are calibrated such that the thermostat 20 opens, thereby serving to discontinue current flow through the embedded circuits 14 and 12 whenever the temperature of the circuit board exceeds a predetermined level. The physical orientation of the thermostat 20 is a function of what portion of the circuit board it is desired be temperature controlled. In the case where the entire board is required to be maintained at an even temperature, the thermostat 20 might best be located at the center of the circuit board and calibrated to close only when the temperature of the board drops below a perdetermined value.

Where the elements which require heating can be arranged so as to occupy a smaller portion of the board than the whole, the area to be heated can be localized by breaking the embedded circuit at strategic points. Looking at the drawing, for example, the thermostat 20 has been physically oriented toward the front portion of the embedded grid; i.e., toward edge 18 to which the connector element would be attached. If the temperature sensitive elements which must be maintained within a narrow tmperature range to insure proper operation are mounted toward the front end 18 of the board, in proximity with the thermostat 20, it is unnecessary to provide heat to the rear portion of the board. In such a case two small diameter holes are drilled one through each bus bar 14, as indicated by holes 21 and 23 in the drawing, thereby isolating the rear portion of the embedded circuit from the forward portion and resulting in the discontinuation of current therethrough. Should it be desirable, on the other hand, to localize heat to the rear of the circuit board the appropriate course of action would be to drill a single hole (not shown) through each of the grid elements 12 arranged near the front edge 18 of the board.

In cases where the environmental temperature range to which the circuit board will be exposed is extreme, soft insulation pads (not shown) may be cemented to both sides of the board to isolate the thermostatically controlled system from the environment.

The concept of the present invention need not be limited to single substrate circuit boards having the heating element embedded therein but rather may be expanded to include circuit board assemblies comprising a number of such substrates as well as to circuit board assemblies made up of so-called multilayer circuit boards, in which case the heating circuit would be incorporated upon one of these layers.

What is claimed is:

1. A temperature controlled circuit board comprising:
(a) an insulating substrate, portions of which are to be selectively temperature controlled;
(b) means for providing heating current to said substrate;
(c) a grid circuit embedded within said substrate, said grid circuit characterized by first and second bus bars coupled to said heating means, and further characterized by a plurality of resistive paths intermediate said bus bars, said paths connected in parallel circuit and disposed to substantially span the entire substrate whereby said heating current can be directed via said grid circuit to selectively heat desired portions of said substrate by severing selected elements of said grid proximate the areas of said substrate where heating is not desired; and (d) a thermostatically controlled switch disposed proximate of said desired portions and connected in circuit with said heating means, said switch adapted to selectively permit or preclude the passage of heating current through the non-severed elements of said grid in response to the temperature of said desired portions.

References Cited

UNITED STATES PATENTS

| | | | |
|---|---|---|---|
| 3,041,441 | 6/1962 | Elbert et al. | 219—345 |
| 3,299,253 | 1/1967 | Lawson | 219—543 |
| 946,643 | 1/1910 | Millspaugh et al. | 219—446 |
| 1,346,793 | 7/1920 | Bunnell et al. | 219—446 |

BERNARD A. GILHEANY, *Primary Examiner.*

F. E. BELL, *Assistant Examiner.*

U.S. Cl. X.R.

219—544